US011310872B2

(12) United States Patent
Sandiford

(10) Patent No.: US 11,310,872 B2
(45) Date of Patent: Apr. 19, 2022

(54) METAL AND COMPOSITE LEADING EDGE ASSEMBLIES

(71) Applicant: ITT Manufacturing Enterprises LLC, Wilmington, DE (US)

(72) Inventor: A. David Sandiford, Lake Hughes, CA (US)

(73) Assignee: ITT Manufacturing Enterprises LLC, Wilmington, DE (US)

( * ) Notice: Subject to any disclaimer, the term of this patent is extended or adjusted under 35 U.S.C. 154(b) by 413 days.

(21) Appl. No.: 16/401,020

(22) Filed: May 1, 2019

(65) Prior Publication Data

US 2019/0261462 A1 Aug. 22, 2019

Related U.S. Application Data

(62) Division of application No. 14/929,058, filed on Oct. 30, 2015, now Pat. No. 10,321,519.

(51) Int. Cl.
*H05B 3/18* (2006.01)
*H05B 3/00* (2006.01)
(Continued)

(52) U.S. Cl.
CPC .......... *H05B 3/18* (2013.01); *B29C 44/188* (2013.01); *B29C 69/00* (2013.01); *B29C 70/682* (2013.01); *B29C 70/683* (2013.01); *B29C 70/84* (2013.01); *B29C 70/88* (2013.01); *B29C 70/885* (2013.01); *B29D 99/0025* (2013.01); *B64D 15/12* (2013.01); *B64D 29/00* (2013.01); *B64D 29/04* (2013.01); *B64D 33/02* (2013.01); *B64D 41/00* (2013.01); *H05B 3/0014* (2013.01); *H05B 3/26* (2013.01); *H05B 3/28* (2013.01);
(Continued)

(58) Field of Classification Search
None
See application file for complete search history.

(56) References Cited

U.S. PATENT DOCUMENTS 5,553,815 A 9/1996 Adams et al.
9,004,407 B2 4/2015 Calder
(Continued)

FOREIGN PATENT DOCUMENTS

BR 102016025186-9 5/2017
EP 2 915 748 9/2015
(Continued)

OTHER PUBLICATIONS

Extended Search Report for EP Application No. 16195483.9 dated Mar. 15, 2017 in 7 pages.

*Primary Examiner* — Joseph M. Pelham
(74) *Attorney, Agent, or Firm* — Knobbe, Martens, Olson & Bear, LLP

(57) ABSTRACT

Various components and methods related to a leading edge assembly are disclosed. The leading edge assembly can include an outer strike shell and a foam core. The foam core can be located inside the outer strike shell. The leading edge assembly can include a heating element with a plurality of sensors and wires. A method of manufacturing a leading edge assembly can include forming a composite layer, applying a metallic layer to the composite layer, installing an electronic device, and inserting a foam core into a cavity bounded by the composite layer and/or the electronic device.

11 Claims, 11 Drawing Sheets

(51) Int. Cl.
| | |
|---|---|
| *B29C 70/68* | (2006.01) |
| *B29C 70/84* | (2006.01) |
| *B29C 70/88* | (2006.01) |
| *B64D 15/12* | (2006.01) |
| *B64D 29/00* | (2006.01) |
| *B64D 41/00* | (2006.01) |
| *H05B 3/26* | (2006.01) |
| *H05B 3/28* | (2006.01) |
| *B29C 69/00* | (2006.01) |
| *B29D 99/00* | (2010.01) |
| *B29C 44/18* | (2006.01) |
| *B64D 29/04* | (2006.01) |
| *B64D 33/02* | (2006.01) |
| *B29L 31/30* | (2006.01) |
| *B29L 31/00* | (2006.01) |
| *C23C 14/20* | (2006.01) |
| *B29K 105/04* | (2006.01) |
| *B29L 31/08* | (2006.01) |
| *B29K 105/20* | (2006.01) |
| *B29K 703/04* | (2006.01) |
| *B29L 31/34* | (2006.01) |

(52) U.S. Cl.
CPC .... *B29K 2105/04* (2013.01); *B29K 2105/046* (2013.01); *B29K 2105/20* (2013.01); *B29K 2703/04* (2013.01); *B29K 2995/0016* (2013.01); *B29L 2031/08* (2013.01); *B29L 2031/3076* (2013.01); *B29L 2031/34* (2013.01); *B29L 2031/7504* (2013.01); *B64D 2033/0233* (2013.01); *B64D 2041/002* (2013.01); *C23C 14/20* (2013.01)

(56) References Cited

U.S. PATENT DOCUMENTS

| | | | |
|---|---|---|---|
| 9,027,884 B2* | 5/2015 | Valleroy | B64D 33/02 |
| | | | 244/134 D |
| 10,321,519 B2* | 6/2019 | Sandiford | B29C 70/683 |
| 2008/0179448 A1 | 7/2008 | Layland | |
| 2010/0000066 A1 | 1/2010 | Boissy | |
| 2013/0230390 A1 | 9/2013 | Bouillon | |
| 2015/0147183 A1 | 5/2015 | Martin | |
| 2015/0210400 A1 | 7/2015 | Gonidec | |
| 2016/0160681 A1* | 6/2016 | Roach | F04D 29/322 |
| | | | 415/177 |
| 2016/0169012 A1* | 6/2016 | DaCunha | C25D 7/00 |
| | | | 416/241 R |
| 2017/0127477 A1 | 5/2017 | Sandiford | |

FOREIGN PATENT DOCUMENTS

| | | |
|---|---|---|
| EP | 3 162 711 | 5/2017 |
| WO | WO 94/26590 | 11/1994 |

* cited by examiner

METAL AND COMPOSITE LEADING EDGE ASSEMBLIES

This application is a divisional of U.S. patent application Ser. No. 14/929,058, filed Oct. 30, 2015 the entire disclosure which is hereby incorporated by reference in its entirety.

BACKGROUND

Field

This disclosure relates to protective covers for leading edge structures in airflows, such as covers for the leading edges of noise attenuation devices of auxiliary power units.

Certain Related Art

An auxiliary power unit ("APU") can provide power to a vehicle, such as an aircraft, ship, or large land vehicle (e.g., large truck). The power from the APU can be used to power various functions, such as temperature control systems, on-board computers, and otherwise. During operation, the APU can ingest air through an air inlet and route the air to a motor, which produces the power. The APU can generate significant noise, which can propagate through an inlet air assembly and disturb passengers on the vehicle (e.g., aircraft) and/or the surrounding environment (e.g., when the aircraft is on the ground). Accordingly, some APUs air inlets incorporate a noise attenuation device, such as one or more acoustic splitters. The acoustic splitters divide the large throat of the overall air inlet into multiple smaller throats, which can reduce noise.

SUMMARY OF CERTAIN FEATURES

In some situations, the air being ingested to the APU can increase the likelihood of damage to the leading edge (e.g., the foremost edge) of the acoustic splitters. For example, the leading edge of the splitters can be subjected to high-speed foreign object debris ("FOD") strikes. FOD strikes can damage the leading edge, which can result in ingestion of portions of the leading edge or inlet into the motor. Also, ice can form on the leading edge, which can impede or even close off the air inlet, which in turn can cause the motor to shutdown, operate less efficiently, or even incur damage. Further, ice can also break off and foul the motor. Another concern is rain erosion, which can be exacerbated by flight velocity. Rain erosion can be particularly problematic in non-metallic substances (e.g., composites), where the hydraulic action can wear through the substances in a short period, resulting in damage to the leading edge.

To protect the acoustic splitters from one or more of the above-described problems, or other problems, the leading edge of the acoustic splitter can be provided with a protective shield, called a leading edge assembly (also called a leading edge cover). This disclosure describes various systems, apparatuses, and methods related to leading edge assemblies. In some embodiments, the leading edge assemblies comprise an outer strike shell. The outer strike shell can include a metallic layer and a composite layer. In some embodiments, the metallic layer is external to the composite layer, which can allow the metallic layer to protect the composite layer against FOD damage, rain erosion, or other damage, and can allow the composite layer to provide strength to the metallic layer.

In some embodiments, the leading edge assembly comprises a core. The outer strike shell can mate with the core, which can allow the outer strike shell to protect the core from FOD damage, rain erosion, or other damage, and can allow the core to support the outer strike shell. The core can be made of a foam material, such as a rigid fire-retardant foam.

Some embodiments include one or more heating elements. The heating elements can transfer heat to the outer strike shell, which can reduce the chance of ice formation. The heating elements can be embedded into the leading edge assembly. In some embodiments, the heating elements are configured to provide substantially even heating across to the outer surface of the outer strike shell. In some examples, the protective cover is manufactured by forming each of the layers of the protective cover onto each other to reduce the assembly. Some embodiments include other electric components, such as sensors.

BRIEF DESCRIPTION OF THE FIGURES

Various embodiments are depicted in the accompanying drawings for illustrative purposes, and should not be interpreted as limiting the scope of the embodiments. Furthermore, various features of different disclosed embodiments can be combined to form additional embodiments, which are part of this disclosure.

DETAILED DESCRIPTION OF CERTAIN EMBODIMENTS

Figure 1:
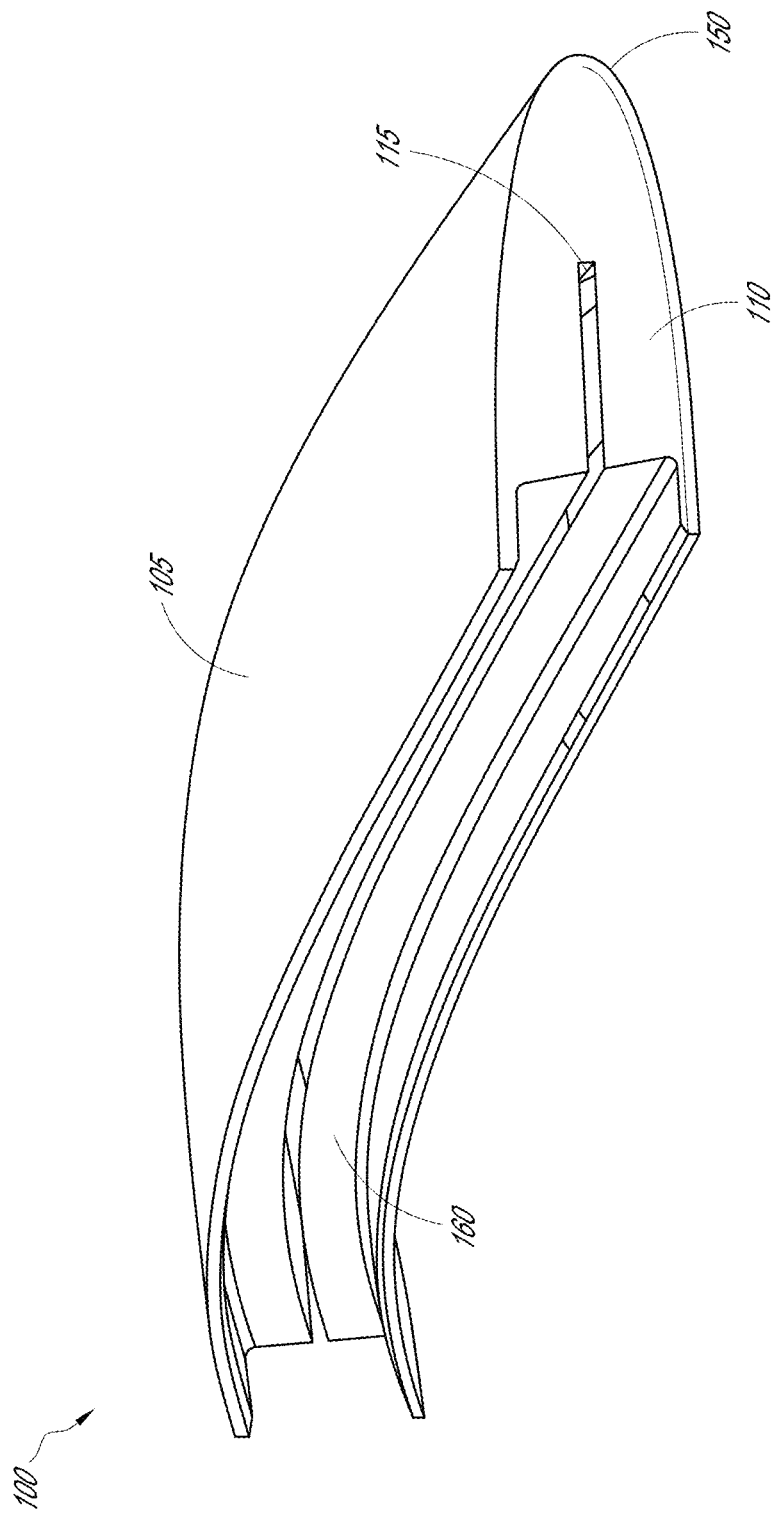
FIG. 1 illustrates a side perspective view of an embodiment of a cover for a noise attenuation device.

Various leading edge assembly covers, assemblies, and manufacturing methods are disclosed to illustrate various examples that may be employed to achieve one or more desired improvements. For purposes of presentation, certain embodiments are disclosed with respect to a noise attenuation device, but the disclosed invention can be used in other contexts as well. Indeed, the described embodiments are examples only and are not intended to restrict the general disclosure presented and the various aspects and features of this disclosure. The general principles described herein may be applied to embodiments and applications other than those discussed herein without departing from the spirit and scope of the disclosure. This disclosure should be accorded the widest scope consistent with the principles and features that are disclosed or suggested herein.

Although certain aspects, advantages, and features are described herein, it is not necessary that any particular embodiment include or achieve any or all of those aspects, advantages, and features. For example, some embodiments may not achieve the advantages described herein, but may achieve other advantages instead. No feature, component, or step is necessary or critical.

Overview

In some embodiments, a leading edge assembly can include an outer strike shell and a core, such as a foam core. The outer strike shell can have a metallic skin and a composite layer. In some embodiments, the metallic skin can be applied (e.g., plated or otherwise applied, such as with an electroless or electrolytic process) to the exterior of composite layer. This can result in a metallic primary layer for rain erosion and FOD strike protection. In some examples, the metallic layer can form a surface thermal mass. The surface thermal mass can spread the heat output substantially evenly across the leading edge surface. In some embodiments, the leading edge assembly can include an embedded heater and/or sensor.

In many respects, forming the primary cover (e.g., the outermost surface of the leading edge assembly) from a metal can provide certain advantages. For example, a metal primary cover can provide significant resistance to impact damage, such as due to FOD strikes. Also, metal covers can provide better heat transfer (e.g., the ability of heat to spread across the leading edge) when compared to composites, which have little heat spread across the surface and thus can make ice formation more likely. However, metal covers can be expensive to form as they may involve matched tooling, and/or a secondary structure to attach the leading edge to the splitter. The metal cover may need to be mated with a heater, which can result in cold spots, less than full heat coverage on the surface, and/or additional weight. Furthermore, manufacturing (e.g., forming and assembling) a metal cover can tend to distort the metal, which can result in an uneven surface area with thick and thin areas, where the thin areas can have the highest loading. The metal cover may need secondary structures (e.g., brackets or otherwise) to be added so that the cover can be mounted to the noise attenuation device.

Composites, on the other hand, can be relatively easy to manufacture and form and typically with less expensive tooling. Mounting structures (which can be metals or non-metals) can be bonded into a composite cover. This can avoid the need to add secondary mounting structure and/or to pierce the leading edge with rivets or fasteners, which can weaken the unit. Disadvantages of using composites can include damage from rain erosion. Although such rain erosion damage can be mitigated through frequent and repeated applications of rain-protective finishes, this is inconvenient and costly. Rain-protective finishes can suppress thermal transmission, resulting in higher power requirements and a reduction in ice deterrence. Rain-protective finishes can also limit heat spreading such that only areas substantially directly over the heater element itself are warmed. In some examples, the lateral spread of heat in composites can result in only 60% of the surface area of the leading edge being heated.

In some examples, the leading edge assembly can be replaceable. This can be convenient because the leading edge assembly may be life-limited, such as due to the environmental factors described above, and the entire air inlet can be expensive to scrap. Due to aerodynamic or acoustic concerns, the outer periphery of the inlet covers can often be comprised of complex compound curves. Therefore, a way to positively locate the acoustic splitter covers on such complex shapes can be beneficial. In some examples, acoustic splitters can be non-symmetrical in shape (e.g., about a longitudinal axis). In some embodiments, several (e.g., 2, 3, 4, 5, 6, 7, or more) leading edge assemblies, each with distinct shapes, may be used for a single air inlet and/or on a single acoustic splitter.

Certain Embodiments of a Leading Edge Assembly

As mentioned above, the leading edge assembly can include an outer strike shell and a core. The outer strike shell can have a composite layer that is external to the core. The outer strike shell can have a metallic skin (also called a metallic layer) that is external to the composite layer. For example, the metallic layer can be deposited onto the composite layer. In various embodiments, the leading edge assembly comprises a noise attenuation device cover.

The leading edge assembly can include a core (also called an interior) that can be formed from a foam, such as a rigid, closed cell, and/or fire retardant foam. In some embodiments, the foam can contain details to locate the leading edge cover assembly in place. In some examples, the foam can thermally insulate and/or isolate the heater, thereby directing thermal energy towards the metallic skin. As will be discussed in more detail below, the foam can add support and/or rigidity to the thin outer strike shell. In some embodiments, the foam forms a part of a multi-layer (e.g., sandwich panel type) construction of the leading edge assembly. In some embodiments, the foam can completely or substantially completely bond with the outer strike shell such that little or no post assembly or bonding processes are subsequently used.

Figure 2:
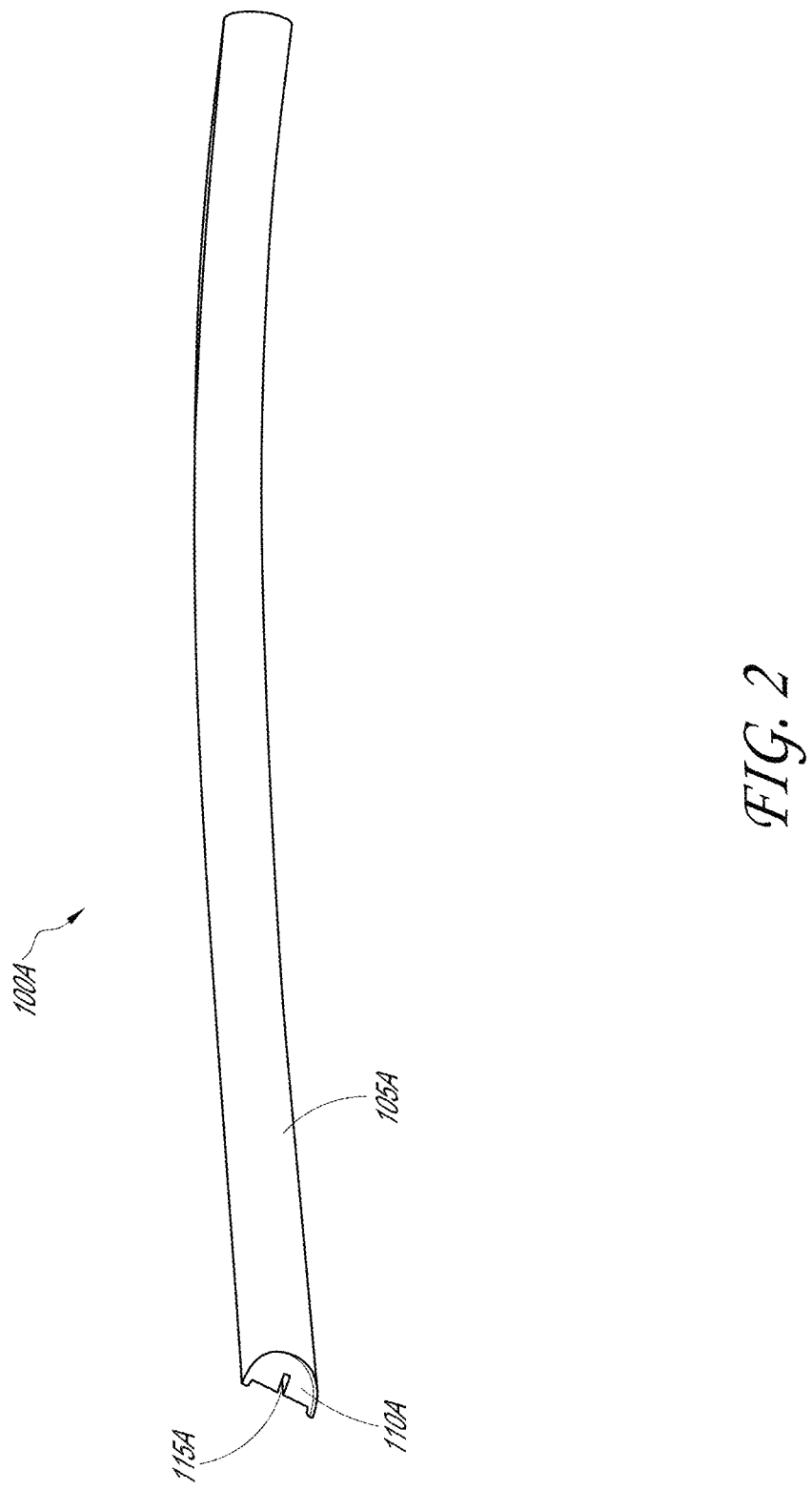
FIG. 2 illustrates a front perspective view of an embodiment of a cover for a noise attenuation device.

FIGS. 1-2 illustrate example embodiments of leading edge covers. The surface and/or shape of the leading edge assembly (e.g., a noise attenuation device cover) can vary. Several different leading edge assemblies can be combined (e.g., lined up end to end) to provide protection along the length of an acoustic splitter. FIGS. 1-2 illustrate two examples of leading edge covers that fit different types of surfaces of a leading edge assembly. The leading edge cover can come in any variety of sizes and shapes.

FIG. 1 illustrates a side view of an embodiment of a leading edge cover 100, such as a leading edge cover that can be configured for an acoustic splitter. In some examples, the leading edge cover 100 can include an outer strike shell 105, which can include an inner composite layer 120 and an outer metallic layer 122. As shown, the outer strike shell 105 can be curved and can have an apex at a forward end 150 (e.g., the end of the shell 105 that will be facing into the wind when installed on an acoustic splitter). Internal to the outer strike shell 105, the leading edge cover 100 can include a core 110, such as a foam core. The core 110 can include a rear surface 160 and a channel 115. In some examples, the channel 115 can be configured to fit over the leading edge surface of a noise attenuation device, such as an acoustic splitter. For example, the channel 115 can be configured to receive a correspondingly shaped portion of the noise attenuation device.

FIG. 2 illustrates a front view of another embodiment of a leading edge cover 100A. As with the leading edge cover 100, the leading edge cover 100A can include an outer strike shell 105A and a core 110A with a channel 115A.

Figure 3:
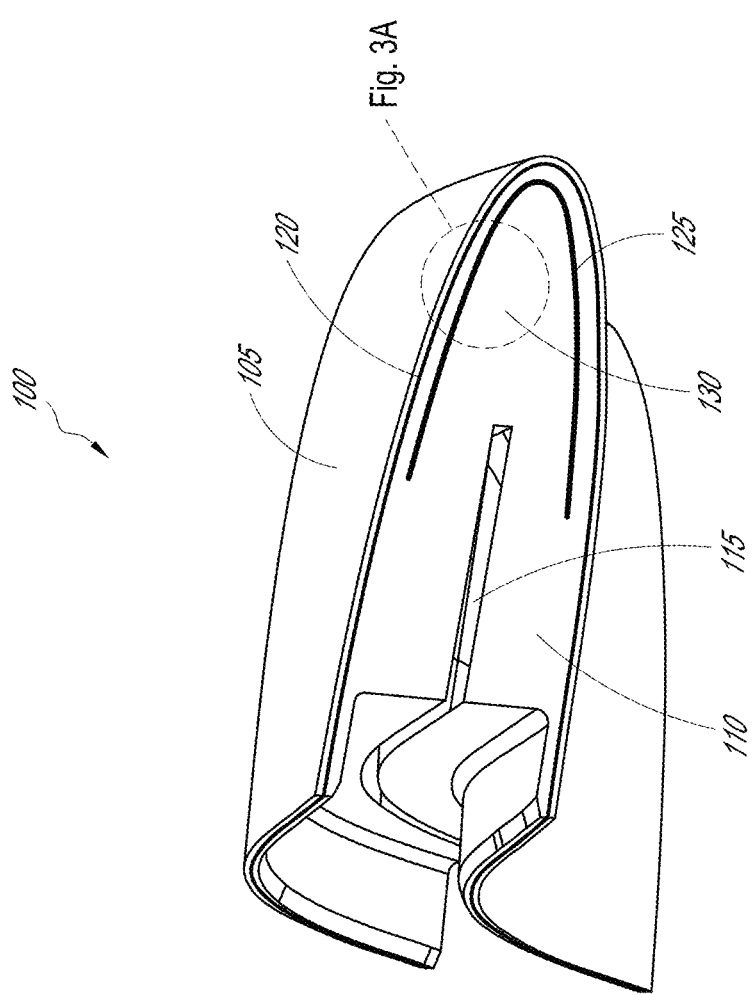
FIG. 3 illustrates a perspective cross-sectional view of an embodiment of a cover for a noise attenuation device.

FIG. 3 illustrates an example of a layered configuration of the leading edge cover 100. For example, as shown, the core 110 can be sandwiched between the upper and lower portions of the outer strike shell 105. In some embodiments, the outer strike shell 105 bounds upper, lower, and forward edges of the core 110.

As shown, the outer strike shell 105 can form the outer surface of the leading edge cover 100. In some embodiments, the outer strike shell 105 can include a composite layer 120. The composite layer 120 can be located along the inner surface of the outer strike shell 105. In some embodiments, a core 110 can be located between the outer strike shell 105. The leading edge cover 100 can include a heating element 125 and sensors and lead wires 130 that are located between the various layers of the leading edge cover 100.

The composite layer 120 can be formed of a various composites. For example, the composite layer 120 can be manufactured from fiber reinforced thermosetting dielectric resins. The fiber layers and alignments can be configured to provide rigidity to match the requirements of the installation. In some examples, the composite layer 120 does not include conductive fibers. This can reduce damage from lightning strikes, which can cause damage to the electrical components housed within the outer strike shell 105. The thickness of the composite layer 120 can be determined by the dielectric withstand voltage requirement. For example, a thinner outer layer may provide better heat transfer, while a thicker outer layer may provide better insulation for the electrical components housed within the outer strike shell 105. This can reduce damage by lightning strikes or protect individuals (e.g., technicians) from electrical shock. In some embodiments, the composite layer 120 comprises 1, 2, 3, 4, 5, 6, or more layers of composite material.

As discussed above, the leading edge cover 100 can include an outer strike shell 105 with a metallic layer 122. In some embodiments, the metallic layer 122 comprises nickel. In some embodiments, the metallic layer 122 can be formed from copper. In some embodiments, the metallic layer 122 comprises hard chrome. In certain embodiments, the metallic layer 122 comprises a combination of metals, such as copper and nickel, copper and hard chrome, or other combinations. In some embodiments, the metallic layer 122 can be deposited with an electroless or electrolytic process.

In some embodiments, the metallic layer 122 is applied to the composite layer 120. For example, vapor deposition can be used to treat the composite layer 120 with titanium, aluminum, nickel, copper, stainless steel, chrome, or other materials. As will be discussed in more detail below, these treatments can be applied over some or all of the completed composite layer 120. In some embodiments, after treatment, the outer surface of the outer strike shell 105 can have an appearance similar to a formed metal leading edge.

As discussed above, in some examples, the leading edge cover 100 can be constructed to inhibit or prevent the formation of ice on the surface of the leading edge cover 100. In some embodiments, ice formation can be deterred by including a heating element 125 in the leading edge cover 100. In some examples, the heating element 125 can be laminated such that the outer and inner dielectric layers are part of the manufacturing process. This can ensure compatible thermal expansion characteristics across various environments, which can result in a longer life for the leading edge cover assembly 100.

Figure 3A:
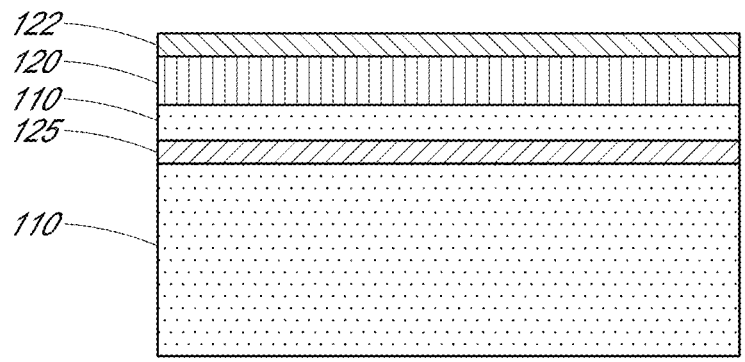
FIGS. 3A-3C illustrate various alternative layer configurations of a portion of the cover of FIG. 3.
Figure 3B:
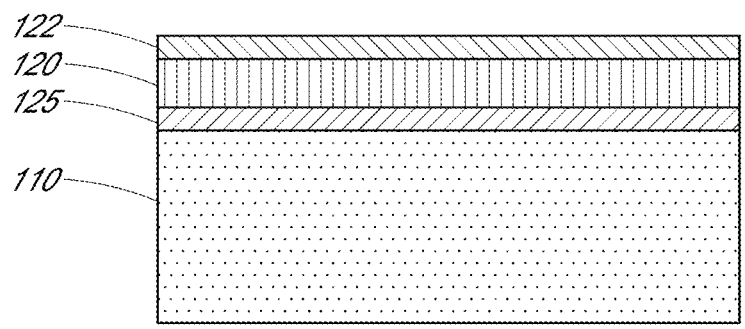
Figure 3C:
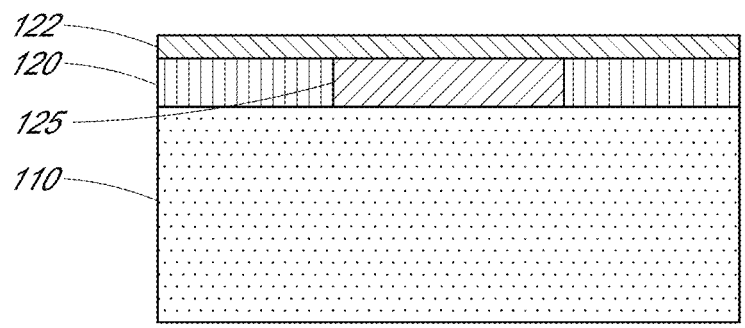

The heating element 125 can be mounted in such a way as to facilitate transferring heat to the composite layer 120 and/or the metallic layer 122. As shown in the cross-sectional view of FIG. 3A, the heating element 125 can be spaced apart from the composite layer 120 by a portion of the core 110. In certain variants, as shown in FIG. 3B, the heating element 125 can be adjacent and/or abutted with the composite layer 120. In some embodiments, such as is shown in FIG. 3C, the heating element 125 is embedded in the composite layer 120. In certain implementations, the heating element 125 can be adjacent and/or abutted with the metallic layer 122, which can provide particularly efficient transfer of heat to the metallic layer 122. In certain implementations, the heating element 125 can be bonded to the inside of the composite layer 120. For example, the heating element 125 can be bonded to the composite layer 120 in certain embodiments in which the heating element 125 is in an elastomer (e.g., silicone rubber) and/or embodiments in which the outer strike shell 105 comprises carbon fiber construction. In some variants, the heating element 125 is positioned in a pocket in the composite layer 120.

The leading edge cover 100 can include various electric elements 130 to support the heater function. In some examples, the various electric elements 130 can include components such as lead wires, fuses, sensors, and thermostats. These components can be installed and tested prior to installing the core 110 within the outer strike shell 105. In some embodiments, the leading edge cover 100 includes one or more sensors (e.g., thermostats) adjacent to, or in, the outer strike shell 105. For example, the sensor or sensors can be positioned near or at the apex of the curved outer strike shell 105.

In some examples, the leading edge cover 100 does not include the heating element 125, such as for applications in which the leading edge assembly will not be used in an environment in which ice formation is a concern. In certain examples, the composite layer 120 (or at least a portion of it) can be formed from a non-reinforced thermoplastic (e.g., polyether ether ketone (PEEK)) or fire retardant nylon. In some embodiments, the composite layer 120 is formed with a 3D Printer. In some embodiments, not including the heating element 125 can allow the leading edge cover 100 to be produced at a lower cost, and/or can permit different materials to be used, such as materials with lower physical properties (e.g., inexpensive materials or lower dielectric properties compared to the materials used in some embodiments with the heating element 125).

As indicated above, the leading edge cover 100 can include a core 110. In some embodiments, the core 110 can provide support for the outer strike shell 105. The core 110 can form a mounting surface for attachment to the acoustic splitter assemblies. In some examples, the core 110 can be formed from an expanding fire retardant foam. In some examples, the core 110 can secure various internal elements (e.g., the heating elements 125, sensors, etc.). This can provide high resistance to vibration and/or shock, which can reduce the chance of damage and/or failure. In some examples, the core 110 can prevent fluid (e.g., water) intrusion. The foam properties can be modified to increase or decrease flexibility, flex, or temperature performance as determined by usage or specification. In some embodiments, the foam comprises a fire-retardant and/or self-skinning foam. For example, the foam can be StaFoam R/T™. In several implementations, the foam comprises a two-component foam. In some variants, the foam comprises a one-component foam. In certain embodiments, the foam comprises a heat curing syntactic epoxy foam.

As will be discussed below, in assembling the leading edge cover 100, the core 110 can be constrained by mold tools. In some examples, the process for assembling the core 110 can be envisioned to provide a fully finished assembly requiring little or no post processing prior to completion. For example, by filling the void between a mounting interface surface and an outer composite shell, a sandwich-panel-type assembly can be formed which provides sufficient torsional and structural rigidity for a leading edge structure. In some embodiments, the mounting interface can include locating details, which are provided by the tooling design and/or can aid in locating one or more portions of a mold relative to the leading edge cover 100.

Certain Methods of Manufacturing a Leading Edge Assembly

In various embodiments, the leading edge cover 100 is iteratively built-up during manufacturing. For example, the outer strike shell 105 can be formed by forming the composite layer 120, and applying the metallic layer 122 to the composite layer 120 (e.g., on an outer surface of the composite layer 120). Electric components, such as heating elements and/or sensors, can be installed in and/or or the outer strike shell 105. The core 110 can be formed within the outer strike shell 105. For example, the core 110 can be inserted into the outer strike shell 105, such as by being injected as a liquid and allowed to harden in the outer strike shell 105. This can provide a core with a shape that closely corresponds to the internal shape of the outer strike shell 105 as well as the electric components.

In some examples, the described manufacturing process can require little to no post processing prior to completion. This can provide a number of advantages. For example, the described manufacturing process can provide fast turn, low cost tooling and/or provide for low cost modifications. In some examples, the described manufacturing process can require no secondary finishing operations, inside or out. As well, in some embodiments, the sandwich panel construction can provide good resistance to FOD strikes. As well, in some examples, the construction of the leading edge cover 100 can provide a structure that can be groundable for lightning strikes.

Figure 4:
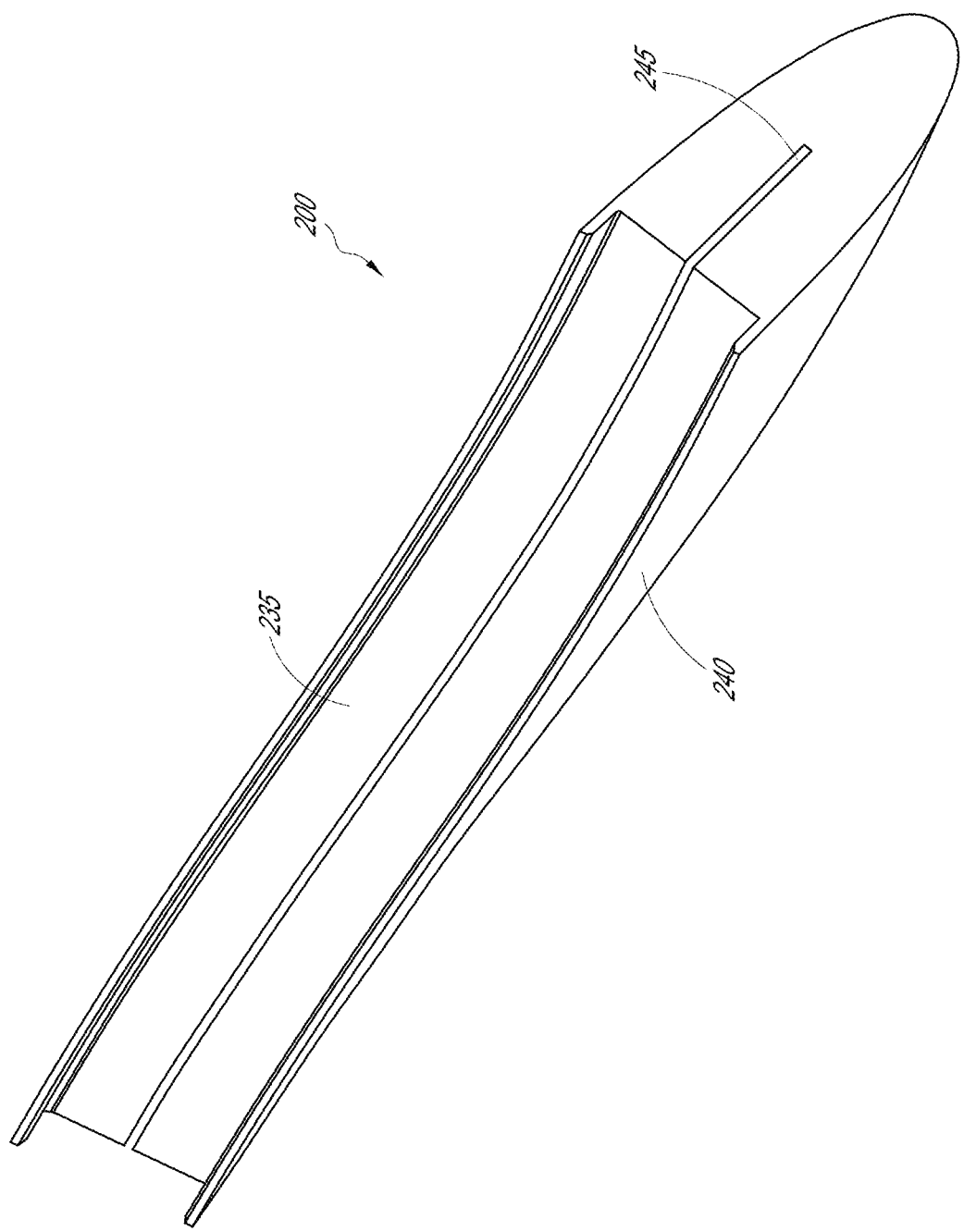
FIG. 4 illustrates a perspective view of an embodiment of a master plug used in the assembly and manufacturing of a cover for a noise attenuation device.

In manufacturing the leading edge cover 100, a master plug can be generated. FIG. 4 illustrates an example of the master plug 200. As shown, in some embodiments, the master plug 200 can resemble or be identical to the overall shape of the completed leading edge cover 100. Like the leading edge cover 100, the master plug 200 can include a curved outer surface 240, a flat top surface 235, and a channel 245.

In some examples, the master plug 200 can be generated using 3D printing. In some examples, the master plug 200 can be created from a nylon type material. To save costs, in some embodiments, the master plug 200 can have a hollow interior, but with sufficient wall thickness to withstand tooling effort. In some examples, the thickness can be at least 0.060 inches. Additional tooling indices, alignments, or separators can be added to the master plug 200 prior to 3D printing.

In some examples, the master plug 200 can be used to form a plurality of tooling for forming the leading edge cover 100. For example, the master plug 200 can be used as a positive piece from which a multi-piece negative mold can be formed, such as the front and rear mold portions discussed below. In order to withstand high temperatures, the initial master plug 200 can be made of a 3D plastic that can be ambient or low temperature cured. In some examples, the master plug 200 can be made from a plurality of components. The components can first be made of "FastCast" polyurethane. Each of the components can be reinforced with a permanent epoxy or polyester glass. In some examples, the master plug 200 is not consumed during tooling and can therefore be reused.

Figure 5:
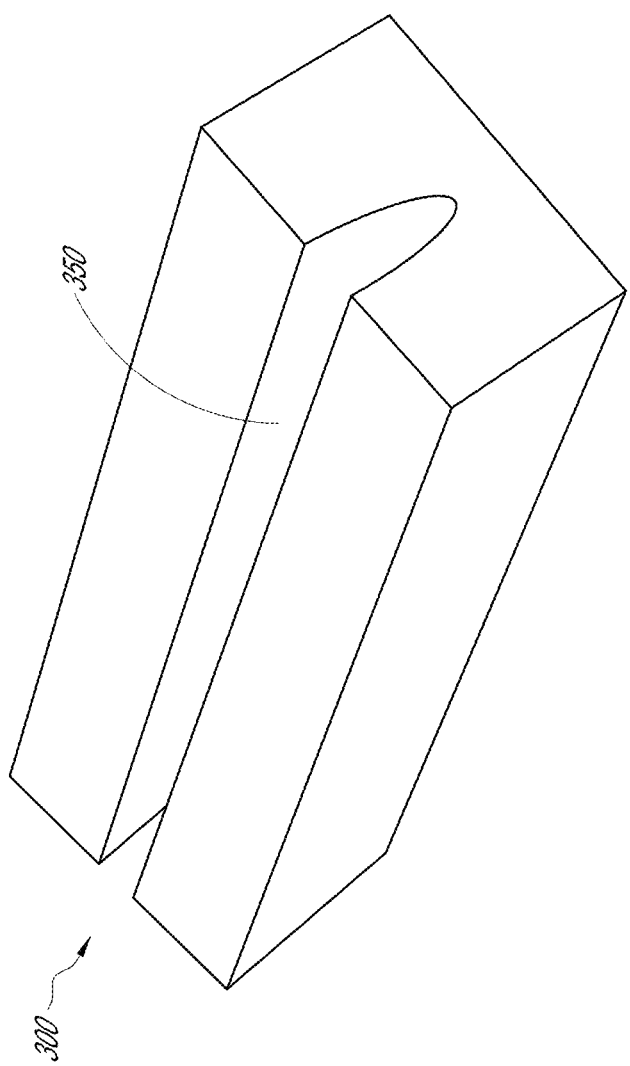
FIG. 5 illustrates a perspective view of an embodiment of an outer strike shell mold used in the assembly and manufacturing of a cover for a noise attenuation device.
Figure 6:
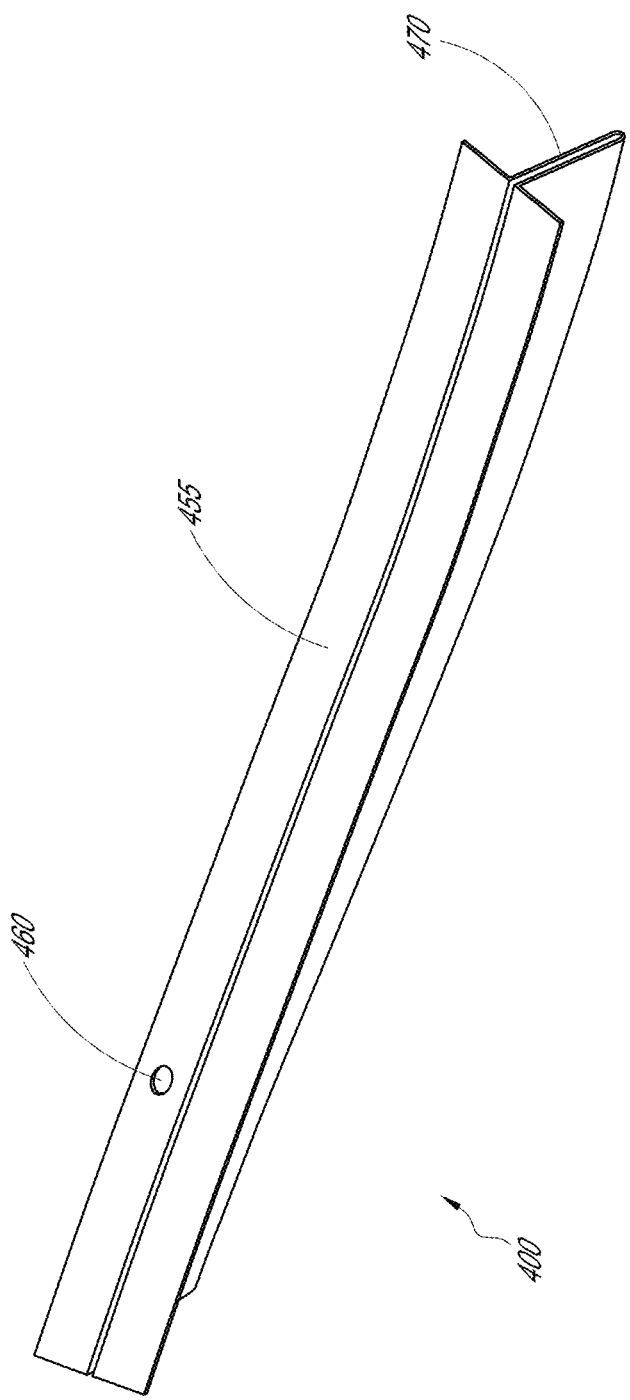
FIG. 6 illustrates a perspective view of an embodiment of a foam core mold used in the assembly and manufacturing of a cover for a noise attenuation device.

FIGS. 5-6 illustrate an embodiment of a plurality of certain tooling components. FIG. 5 illustrates an example of a front mold portion, such as an outer strike shell mold 300. In some examples, the outer strike shell mold 300 includes an inner curved surface 350. As will be described below, the inner curved surface 350 can be used to form the outer strike shell 105. In some embodiments, the inner curved surface 350 corresponds to the curved outer surface 240 of the master plug 200.

FIG. 6 illustrates an example of a rear mold portion, such as a core mold 400. In some embodiments, the core mold 400 can be used to form some or all of the inner mounting interface of the leading edge cover 100. The core mold 400 can include a surface 455. As will be discussed in more detail below, the surface 455 can form the rear surface 160 of the leading edge cover 100. The core mold 400 can include a fold or projection 470. In some examples, the projection 470 can be used to form the channel 115 of the leading edge cover 100. In some embodiments, the plug 200, outer strike shell mold 300, and/or the core mold 400 are made of nickel. This can facilitate higher production rates and/or quality. In some examples, using nickel tools can allow quick heating and cooling of the material of the outer strike shell 105, which can provide for a smooth and metallic finish. In some embodiments, the core mold 400 includes one or more ports 460.

In some examples, the outer strike shell mold 300 can be used to form the outer strike shell 105. In some embodiments, the outer strike shell 105 can be formed by laying up multiple layers of composite onto the inner curved surface 350 of the outer strike shell mold 300. In some examples, the composite used can be a glass-reinforced resin. In other examples, the outer strike shell 105 can be formed using vacuum bag type processing. In examples where heating is desired, the heating element 125 can be built into the layers of the composite as the multiple layers are being laid up. In some examples, the outer strike shell 105 can built-up to be at least about 0.03 inches thick.

After the outer strike shell 105 is formed, it can be cured and/or trimmed to a desired size. In some embodiments, the metallic layer 122 (e.g., nickel, copper, or otherwise) can be applied to the outer strike shell 105. For example, the outer strike shell 105 can be coated using a plating process, such as electroless or electrolytic plating. In some variants, the metallic layer 122 is applied with a vapor deposition process. In some embodiments, such as certain embodiments using an electroless nickel application process, the deposition thickness is at least about 0.0005 inches and/or less than or equal to about 0.0008 inches. The application can be sufficient to support conventional electrolytic plating. In some embodiments, such as certain embodiments using an electrolytic nickel plating process, the thickness is at least about 0.002 inches and/or less than or equal to about 0.005 inches. In certain implementations, the metallic layer 122 covers at least about 90% of the surface area of a curved outer surface of the outer strike shell 105. In some embodiments, the lead wires, sensors, fuses and/or other electronic components 130 can be installed and tested after the metallic layer 122 is applied to the outer strike shell 105. In some variants, at least one lead wire, sensor, fuse, and/or other electronic component can be installed and tested before the metallic layer 122 is applied.

Figure 7:
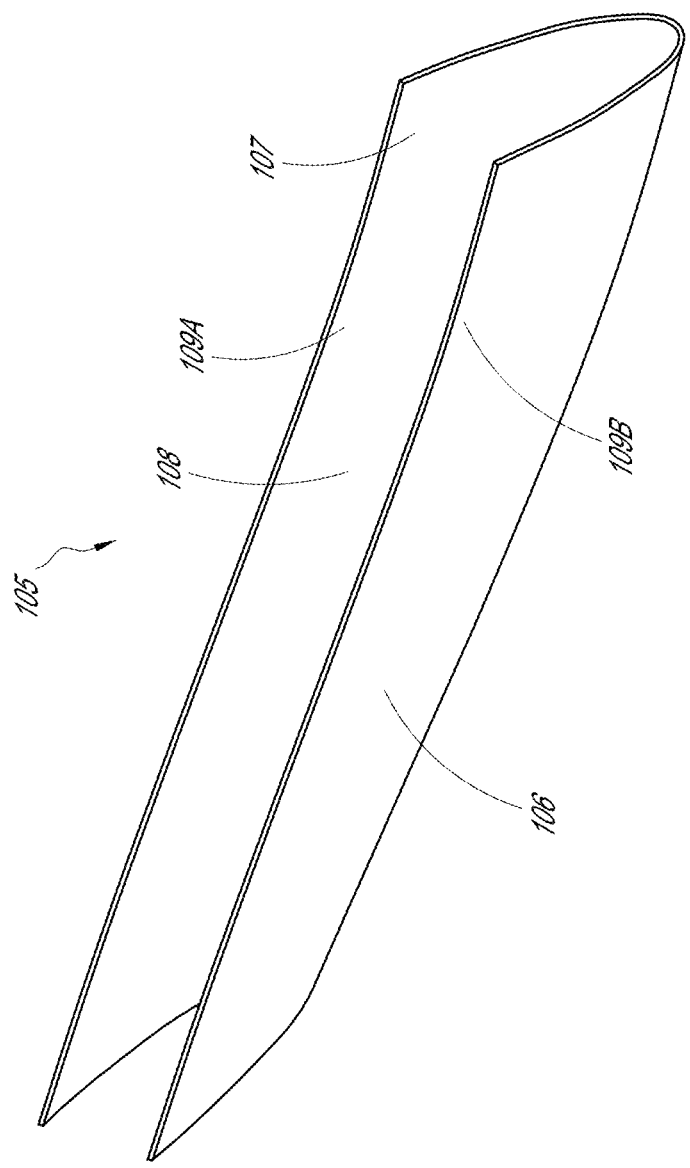
FIG. 7 illustrates a perspective view of an embodiment of an outer strike shell of the cover for a noise attenuation device.

FIG. 7 illustrates an example of a formed outer strike shell 105. As was described above, the outer strike shell 105 can have an outside surface 106. The outside surface 106 can comprise the metallic layer 122. As shown, the outer strike shell 105 can include an inside surface 107 and an inner cavity 108. The outer strike shell 105 can have ends 109A, 109B. As will be described in more detail below, in some embodiments, the inside surface 107 and inner cavity 108 can interface with the core 110.

As described above, the leading edge cover 100 can be manufactured such that it produces a sandwiched configuration. In some examples, to produce the sandwiched configuration, the completed outer strike shell 105 can be placed back in the outer strike shell mold 300. This can result in the outside surface 106 of the outer strike shell 105 being adjacent and/or in contact with the inner curved surface 350 of the outer strike shell mold 300. In some embodiments, the core mold 400 can be used to form a rear portion of the leading edge cover 100. For example, the core mold 400 can be prepped, located, and/or secured relative to the outer strike shell 105 and/or the outer strike shell mold 300. In some examples, the core mold 400 can be positioned between the ends 109A, 109B, within the inner cavity 108, and/or adjacent the inside surface 107 of the outer strike shell 105. In some implementations, the projection 470 of the core mold 400 can extend into the inner cavity 108.

In some examples, once the core mold 400 has been put into place, the material to form the core 110 can be mixed and introduced into the inner cavity 108. For example, the core 110 can be injected as a liquid through the ports 460, which can be located on the top of the core mold 400. The liquid core material can fill some or all of the space in the inner cavity 108. In some embodiments, the liquid core material cannot fill the space occupied by the projection 470, which can result in that space becoming the channel 115. In some examples, as discussed above, the core 110 can be composed of a two-component fire retardant material, such as fire retardant polyurethane. After injection of the core material, the core can be allowed to cure for a period. Some embodiments include heating to facilitate the curing process.

After the core 110 has cured, the outer strike shell mold 300 and the core mold 400 can be separated (e.g., pulled apart) from each other to reveal the leading edge cover 100. The leading edge cover 100 can then be prepared for final inspection and installation without any additional processing required.

Figure 8:
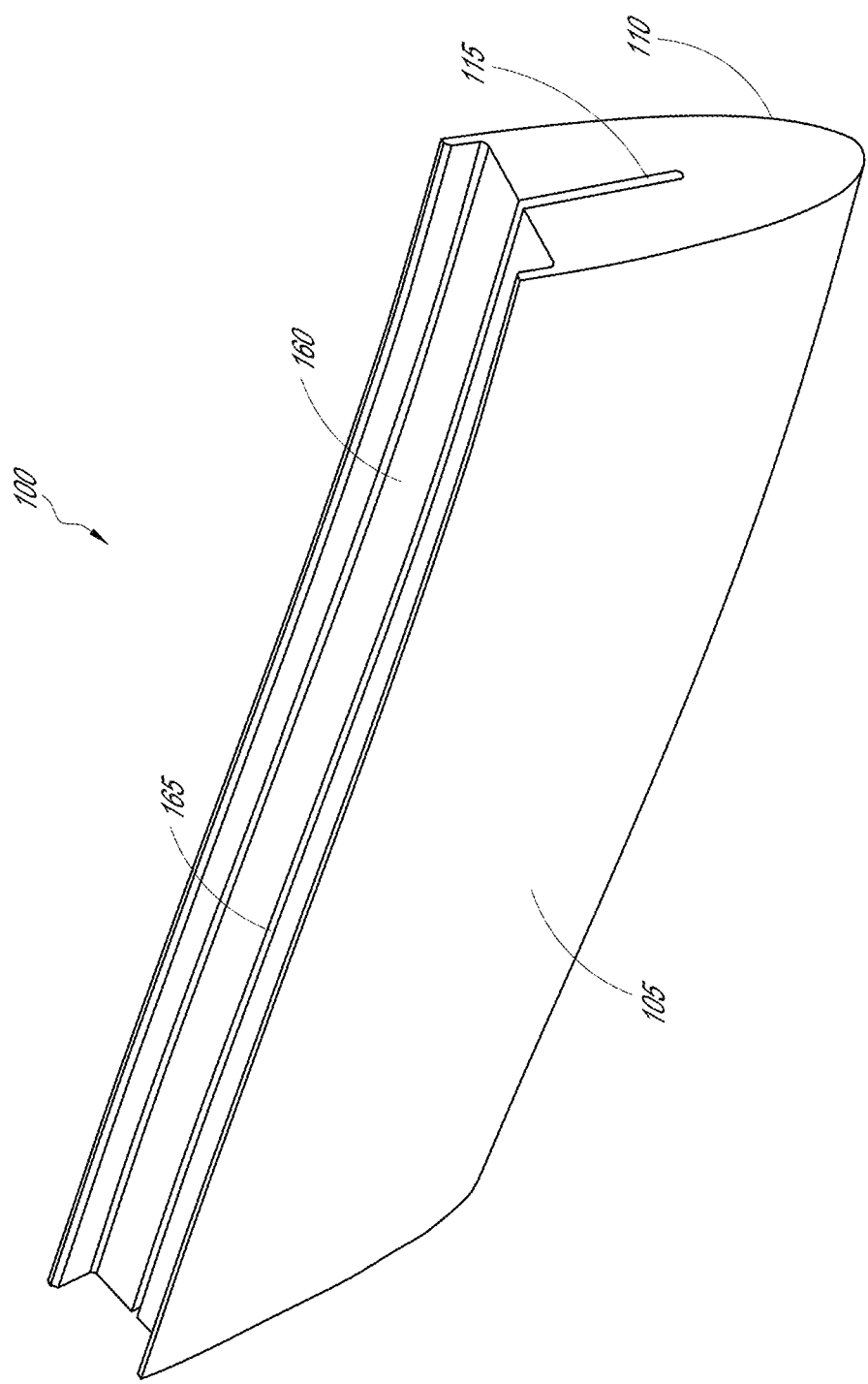
FIG. 8 illustrates a perspective view of an embodiment of an assembled cover for a noise attenuation device.

An example of the formed leading edge cover 100 is illustrated in FIG. 8. As shown in FIG. 8, the leading edge cover 100 includes an outer strike shell 105 and an inner core 110. The core 110 can further include an opening 165 and a channel 115 that can be formed by the projection 470 of the core mold 400. As well, the core 110 can include a rear surface 160 formed by the shape of the underside of the surface 455 of the core mold 400. For example, in the embodiments shown, the rear surface 160 is generally flat.

Figure 9:
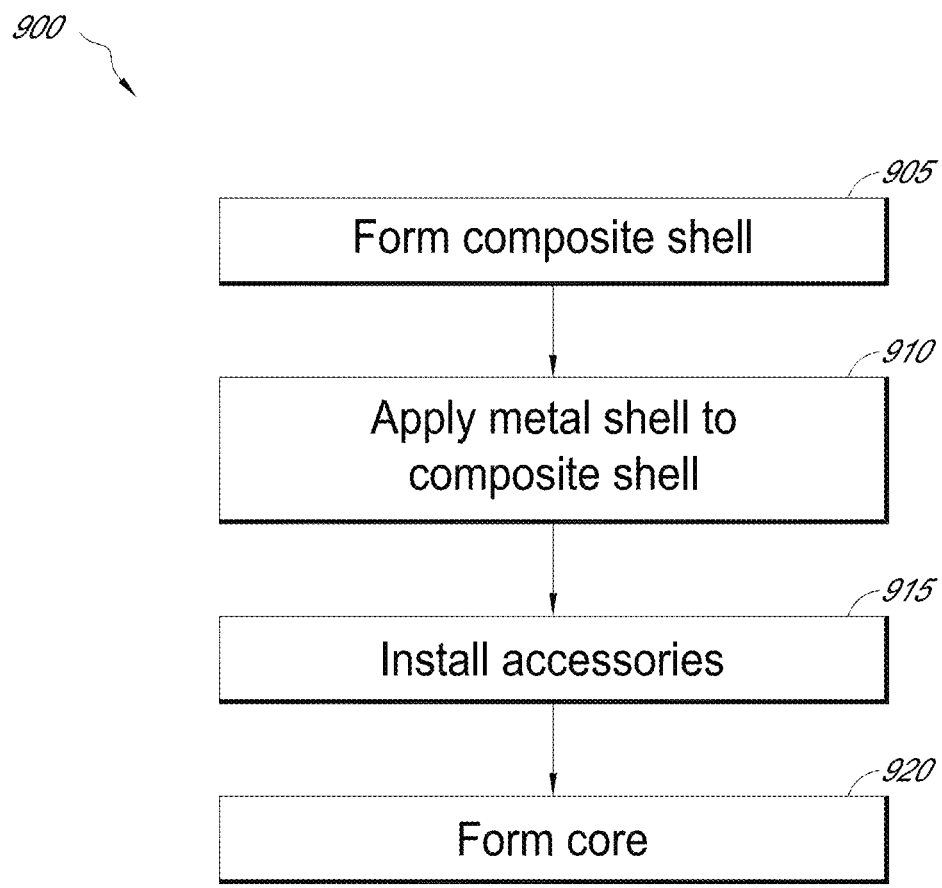
FIG. 9 schematically illustrates an embodiment of a method for manufacturing a leading edge cover.
Figure 10:
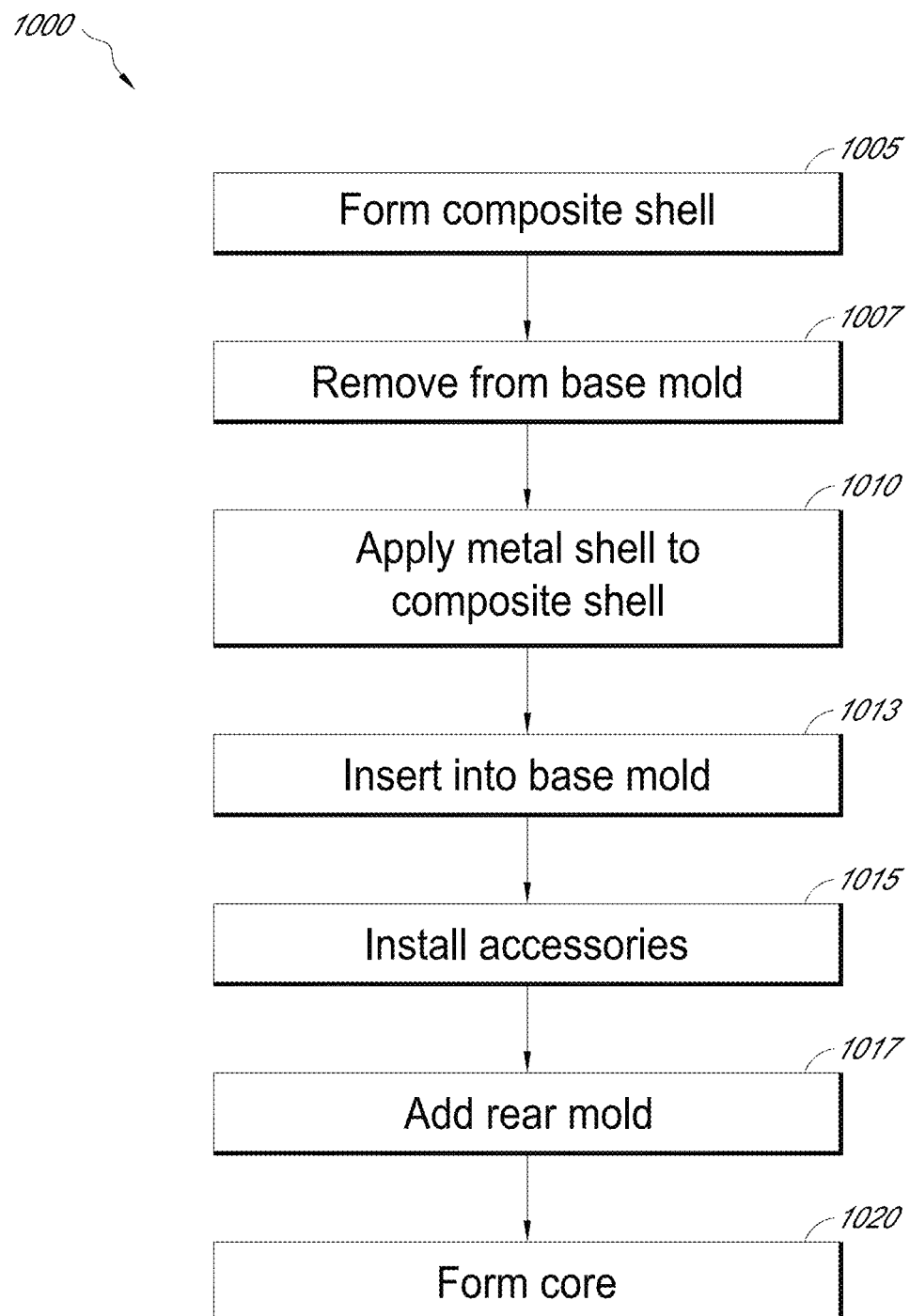
FIG. 10 schematically illustrates another embodiment of a method for manufacturing a leading edge cover.

The method of manufacturing a leading edge cover can include any combination of the aforementioned steps. FIGS. 9-10 illustrate two example embodiments of methods for manufacturing a leading edge cover 900, 1000. With regard to FIG. 9, as shown, in some embodiments, the method 900 can include forming a composite layer 905. For example, layers of composite material can be built-up on the inside of the curved mold. Some embodiments include applying a metal layer to the composite layer 910. For example, the outer strike shell 105 can be coated using an electroless or electrolytic plating process. Certain embodiments include installing accessories (e.g., electronics, such as heating elements, sensors, etc.) 915. For example, the accessories 915 can be installed into the inner surface of the outer strike shell 105. Some variants include forming a core 920. For example, the core 920 can be a foam core that is injected as a liquid and allowed to harden in the outer strike shell 105.

The method of manufacturing 1000 can include any or all of the steps of the method 900. As shown in FIG. 10, in some embodiments, the method 1000 can include forming a composite layer 1005. In some examples, layers of composite material can be build-up on the inside of the curved mold. The composite layer 1005 can be removed from the base mold 1007. In some examples, the outer strike shell mold is not consumed in the forming of the composite layer 1005. A metal layer can be applied to the composite layer 1010. For example, the outer strike shell 105 can be coated using an electroless or electrolytic plating process. The method of manufacture 1000 can then include inserting the composite layer into the base mold 1013. For example, the base mold 1013 can retain the composite layer 1005 as the leading edge cover is assembled. The method of manufacturing 1000 can include installing accessories 915 (e.g., electronics, such as heating elements, sensors, etc.) into the inner surface of the composite layer 1015. For example, the accessories 915 can be heating elements and/or sensors. The method of manufacture 1000 can include adding a rear mold into the formed composite layer 1017. For example, the rear mold can be used to form some or all of the inner mounting interface of the leading edge cover. The method can include forming the core into the composite layer. For example, the method can include introducing the core material through one or more ports and allowing the core material to cure.

Certain Terminology

Terms of orientation used herein, such as "top," "bottom," "horizontal," "vertical," "longitudinal," "lateral," and "end" are used in the context of the illustrated embodiment. However, the present disclosure should not be limited to the illustrated orientation. Indeed, other orientations are possible and are within the scope of this disclosure. Terms relating to circular shapes as used herein, such as diameter or radius, should be understood not to require perfect circular structures, but rather should be applied to any suitable structure with a cross-sectional region that can be measured from side-to-side. Terms relating to shapes generally, such as "circular" or "cylindrical" or "semi-circular" or "semi-cylindrical" or any related or similar terms, are not required to conform strictly to the mathematical definitions of circles or cylinders or other structures, but can encompass structures that are reasonably close approximations.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language, such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

The terms "approximately," "about," and "substantially" as used herein represent an amount close to the stated amount that still performs a desired function or achieves a desired result. For example, in some embodiments, as the context may dictate, the terms "approximately", "about", and "substantially" may refer to an amount that is within less than or equal to 10% of the stated amount. The term "generally" as used herein represents a value, amount, or characteristic that predominantly includes or tends toward a particular value, amount, or characteristic. As an example, in certain embodiments, as the context may dictate, the term "generally parallel" can refer to something that departs from exactly parallel by less than or equal to 20 degrees.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B, and C" can include a first processor configured to carry out recitation A working in conjunction with a second processor configured to carry out recitations B and C.

The terms "comprising," "including," "having," and the like are synonymous and are used inclusively, in an open-ended fashion, and do not exclude additional elements, features, acts, operations, and so forth. Likewise, the terms "some," "certain," and the like are synonymous and are used in an open-ended fashion. Also, the term "or" is used in its inclusive sense (and not in its exclusive sense) so that when used, for example, to connect a list of elements, the term "or" means one, some, or all of the elements in the list.

Overall, the language of the claims is to be interpreted broadly based on the language employed in the claims. The language of the claims is not to be limited to the non-exclusive embodiments and examples that are illustrated and described in this disclosure, or that are discussed during the prosecution of the application.

SUMMARY

Although various covers have been disclosed in the context of certain embodiments and examples (e.g., noise attenuation devices), this disclosure extends beyond the specifically disclosed embodiments to other alternative embodiments and/or uses of the embodiments and certain modifications and equivalents thereof. For example, any of the disclosed covers can be used on the leading edge of other types of devices, such as wings, vanes, blades, propellers, impellers, or otherwise. Various features and aspects of the disclosed embodiments can be combined with or substituted for one another in order to form varying modes of the conveyor. The scope of this disclosure should not be limited by the particular disclosed embodiments described herein.

Certain features that are described in this disclosure in the context of separate implementations can also be implemented in combination in a single implementation. Conversely, various features that are described in the context of a single implementation can also be implemented in multiple implementations separately or in any suitable subcombination. Although features may be described above as acting in certain combinations, one or more features from a claimed combination can, in some cases, be excised from the combination, and the combination may be claimed as any subcombination or variation of any subcombination.

Moreover, while operations may be depicted in the drawings or described in the specification in a particular order, such operations need not be performed in the particular order shown or in sequential order, and all operations need not be performed, to achieve the desirable results. Other operations that are not depicted or described can be incorporated in the example methods and processes. For example, one or more additional operations can be performed before, after, simultaneously, or between any of the described operations. Further, the operations may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Some embodiments have been described in connection with the accompanying figures. The figures are drawn and/or shown to scale, but such scale should not be limiting, since dimensions and proportions other than what are shown are contemplated and are within the scope of the disclosed invention. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, any methods described herein may be practiced using any device suitable for performing the recited steps.

In summary, various embodiments and examples of leading edge assemblies have been disclosed. Although the assemblies have been disclosed in the context of those embodiments and examples, this disclosure extends beyond the specifically disclosed embodiments to other alternative embodiments and/or other uses of the embodiments, as well as to certain modifications and equivalents thereof. This disclosure expressly contemplates that various features and aspects of the disclosed embodiments can be combined with, or substituted for, one another. Thus, the scope of this disclosure should not be limited by the particular disclosed embodiments described above, but should be determined only by a fair reading of the claims that follow.

The following is claimed:

1. A method for manufacturing a leading edge assembly, the method comprising:
   forming a composite layer;
   applying a metal layer to an exterior surface of the composite layer;
   installing an electronic component to an interior surface of the composite layer;
   injecting a foam core material into a cavity bounded by the interior surface of the composite layer and/or the electronic component;
   forming a channel in the foam core material, the channel configured to engage with a portion of an air inlet component; and
   curing the foam core material in the cavity.

2. The method of manufacturing of claim 1, wherein forming the composite layer comprises laying-up multiple layers of a composite on a curved surface of a mold.

3. The method of manufacturing of claim 2, wherein the composite comprises glass reinforced resin.

4. The method of manufacturing of claim 2, wherein forming the composite layer further comprises applying a vacuum to the layers of composite.

5. The method of manufacturing of claim 1, wherein applying the metal layer to the exterior surface of the composite layer comprises using vapor deposition to deposit a metal to the exterior surface of the composite layer.

6. The method of manufacturing of claim 1, wherein applying the metal layer to the exterior surface of the composite layer comprises plating the exterior surface of the composite layer with a metal.

7. The method of manufacturing of claim 6, wherein plating the exterior surface of the composite layer with a metal comprises using electroless or electrolytic nickel plating.

8. The method of manufacturing of claim 1, wherein installing the electronic component to the composite layer comprises embedding a heating element in the composite layer.

9. The method of manufacturing of claim 1, further comprising forming a front mold and a rear mold from a master plug, wherein the front mold includes a curved surface and the rear mold includes a protrusion, the protrusion configured to form the channel.

10. The method of manufacturing of claim 1, wherein injecting the foam core material into the cavity bounded by the interior surface of the composite layer comprises injecting the foam core material as a liquid into the cavity via a port in a rear mold structure.

11. The method of manufacturing of claim 1, further comprising installing the composite layer in an outer mold before injecting the foam core material.

\* \* \* \* \*